(12) United States Patent
Khoshkava et al.

(10) Patent No.: US 10,584,689 B2
(45) Date of Patent: Mar. 10, 2020

(54) LOCAL HAPTIC ACTUATION SYSTEM

(71) Applicant: IMMERSION CORPORATION, San Jose, CA (US)

(72) Inventors: Vahid Khoshkava, San Jose, CA (US); Juan Manuel Cruz Hernandez, San Jose, CA (US); Vincent Levesque, San Jose, CA (US)

(73) Assignee: IMMERSION CORPORATION, San Jose, CA (US)

( * ) Notice: Subject to any disclaimer, the term of this patent is extended or adjusted under 35 U.S.C. 154(b) by 0 days.

(21) Appl. No.: 15/256,197

(22) Filed: Sep. 2, 2016

(65) Prior Publication Data

US 2018/0066636 A1 Mar. 8, 2018

(51) Int. Cl.
*F03G 7/06* (2006.01)
*C22F 1/00* (2006.01)
*G06F 3/01* (2006.01)
*B06B 1/06* (2006.01)
*B81B 3/00* (2006.01)

(52) U.S. Cl.
CPC ............ *F03G 7/065* (2013.01); *B06B 1/0688* (2013.01); *B81B 3/0024* (2013.01); *C22F 1/006* (2013.01); *G06F 3/016* (2013.01); *B81B 2201/031* (2013.01); *B81B 2201/032* (2013.01)

(58) Field of Classification Search
USPC .............................. 340/407.1, 506, 511, 521
See application file for complete search history.

(56) References Cited

U.S. PATENT DOCUMENTS

| 2009/0047197 A1* | 2/2009 | Browne .................. F16D 28/00 422/307 |
| 2009/0250267 A1 | 10/2009 | Heubel et al. |
| 2010/0171393 A1 | 7/2010 | Pei et al. |
| 2012/0114778 A1 | 5/2012 | Keefe et al. |

(Continued)

OTHER PUBLICATIONS

Michael Dickey et al. "Shape-shifting Liquid-Metal Antennas," Video clip posted at http://spectrum.ieee.org/video/telecom/wireless/shapeshifting-liquidmetal-antennas?utm_campaign=Weekly%20Notification&utm_source=boomtrain&utm_medium=email&utm_content=Shape-shifting%20Liquid-Metal%20Antennas&bt_alias=eyJ1c2VySWQiOil0ZTkzMzMyYS01MjM2LTRmMzltOWViYy1hNGJjYWU3MWRjYmEifQ%3D%3D.

(Continued)

*Primary Examiner* — Daryl C Pope
(74) *Attorney, Agent, or Firm* — Medler Ferro Woodhouse & Mills

(57) ABSTRACT

A haptic actuator device includes a surface with a mechanical property responsive to localized temperature changes. The surface can include a layer or sheet comprising a shape-memory material. The haptic actuator device can further include an actuator configured to selectively deform a plurality of regions in the sheet; and a temperature controller adapted to control the temperatures of the plurality of regions. A method of localized actuation includes selectively controlling the temperatures of the plurality of regions to be above a shape-memory transition temperature of the shape-memory material; selectively deforming at least one of the regions; while maintaining the deformation of the at least one region, lowering the temperature of the at least one region to below the shape-memory transition temperature; subsequently withdrawing the applied stress; and thereafter heating the at least one region to above the shape-memory (Continued)

transition temperature, causing the region to return to its pre-deformation shape.

19 Claims, 6 Drawing Sheets

(56) References Cited

U.S. PATENT DOCUMENTS

2013/0154984 A1* 6/2013 Gondo ................... G06F 3/016
 345/173
2016/0124510 A1 5/2016 Hyde et al.

OTHER PUBLICATIONS

Niu, Xiaofan et al., "Bistable Large-Strain Actuation of Interpenetrating Polymer Networks", Advanced Materials, www.advmat.de, published Sep. 18, 2012, pp. 6513-6519.
"Extended European Search Report for European Application No. 17187929.9", dated Jan. 23, 2018, 10 pages.

* cited by examiner

LOCAL HAPTIC ACTUATION SYSTEM

TECHNICAL FIELD

This disclosure relates to haptic actuators and systems employing haptic actuators, and more particularly to locally deformable haptic actuators and systems.

BACKGROUND

Haptic actuators suitable for inclusion in thin structures, such as wearable articles and ultrathin computer-human interfaces, are being developed. Examples include haptic actuators in keypads with haptic feedback on computers or smartphones and haptic notification devices in articles of clothing or wristbands. Such haptic actuators provide advantages such as enabling positive confirmation of key touch and providing haptic notification from wearable articles.

While various haptic actuators exit, development of haptic actuators with advantageous characteristics is continuing.

SUMMARY

This disclosure relates to a haptic actuator device that is capable of local actuation, i.e., a haptic actuator device capable of producing localized deformation in multiple locations within a medium.

In one aspect, a haptic actuator device includes a surface with a mechanical property responsive to localized temperature changes. Such a surface can include a layer or sheet comprising a shape-memory material, such as a shape memory polymer (SMP). The haptic actuator device can further include an actuator configured to selectively deform a plurality of regions in the sheet; and a temperature controller, such as a heater or cooler, adapted to control the temperatures of the plurality of regions in the sheet. In some examples, a plurality of actuators are disposed adjacent to corresponding plurality of regions of the sheet comprising the shape-memory material and adapted to individually deform the regions of the sheet. For example, an actuator can be made of a layer of an electro-active polymer (EAP), such as polyvinylidene fluoride (PVDF)-based actuators such as P(VDF-TrFE-CFE) terpolymers, P(VDF-TrFE-CTFE) terpolymers, PVDF-TrFE copolymer, or PVDF (homopolymer, copolymer, terpolymer), which can be blended with a solid additive or polymer additive, or an elastic dielectric material, laminated with the sheet comprising the shape-memory material, with electrode layers sandwiching the EAP layer or the laminate. In some examples, temperature control can be accomplished through resistive heating wires disposed adjacent, or embedded in, the SMP layer, or conductive filler dispersed, and forming conductive paths, in the SMP. There can be other layered structures of EAP and SMP, such as an SMP layer sandwiched between two EAP layers, with the layered EAP-SMP-EAP structure sandwiched between electrode layers. In another example, an actuator can be another type of actuator, such as electromagnetic actuator, positioned adjacent to the corresponding region of the sheet comprising the shape-memory material and adapted to deform the corresponding region upon actuation. In other examples, magnetic actuators or their components, such as coils or magnets can be embedded in the SMP and deform SMP when magnetically actuated.

In another example, a haptic actuator device includes a sheet comprising a shape-memory material, such as a shape memory polymer, and a transducer material for converting a non-mechanical energy to mechanical energy, such as an electromechanical transducer material, mixed with the shape-memory material. In one example, the sheet includes interpenetrating networks of polymers, one of which is a shape-memory polymer, and another one of which is an EAP. The haptic actuator device further includes a plurality of non-mechanical energy sources, such as one or more arrays of electrodes, formed on a surface of the sheet and adapted to actuate the transducer material to apply stress locally to a plurality of regions in the sheet. The device further includes a temperature controller, such as a heater or cooler, adapted to selectively control the temperatures of the plurality of regions in the sheet.

In another aspect of the present disclosure, a haptic actuator device includes a sheet comprising a reversible shape-memory material, such as a reversible shape-memory polymer, a temperature controller, such as a heater or cooler, adapted to selectively control the temperatures of a plurality of regions in the sheet.

In another aspect of the present disclosure, a method of localized actuation includes controlling the temperature of at least one of a plurality of regions in a sheet comprising a shape-memory material to be above a shape-memory transition temperature (such as glass-transition temperature, $T_g$) of the shape-memory material; applying a stress to selectively deform the at least one region of the sheet; while maintaining the deformation of the at least one region, lowering the temperature of the at least one region to below the shape-memory transition temperature; subsequently withdrawing the applied stress; and thereafter heating the at least one region to above the shape-memory transition temperature of the shape-memory material, causing the region to return to its pre-deformation shape.

DETAILED DESCRIPTION

Figure 1:
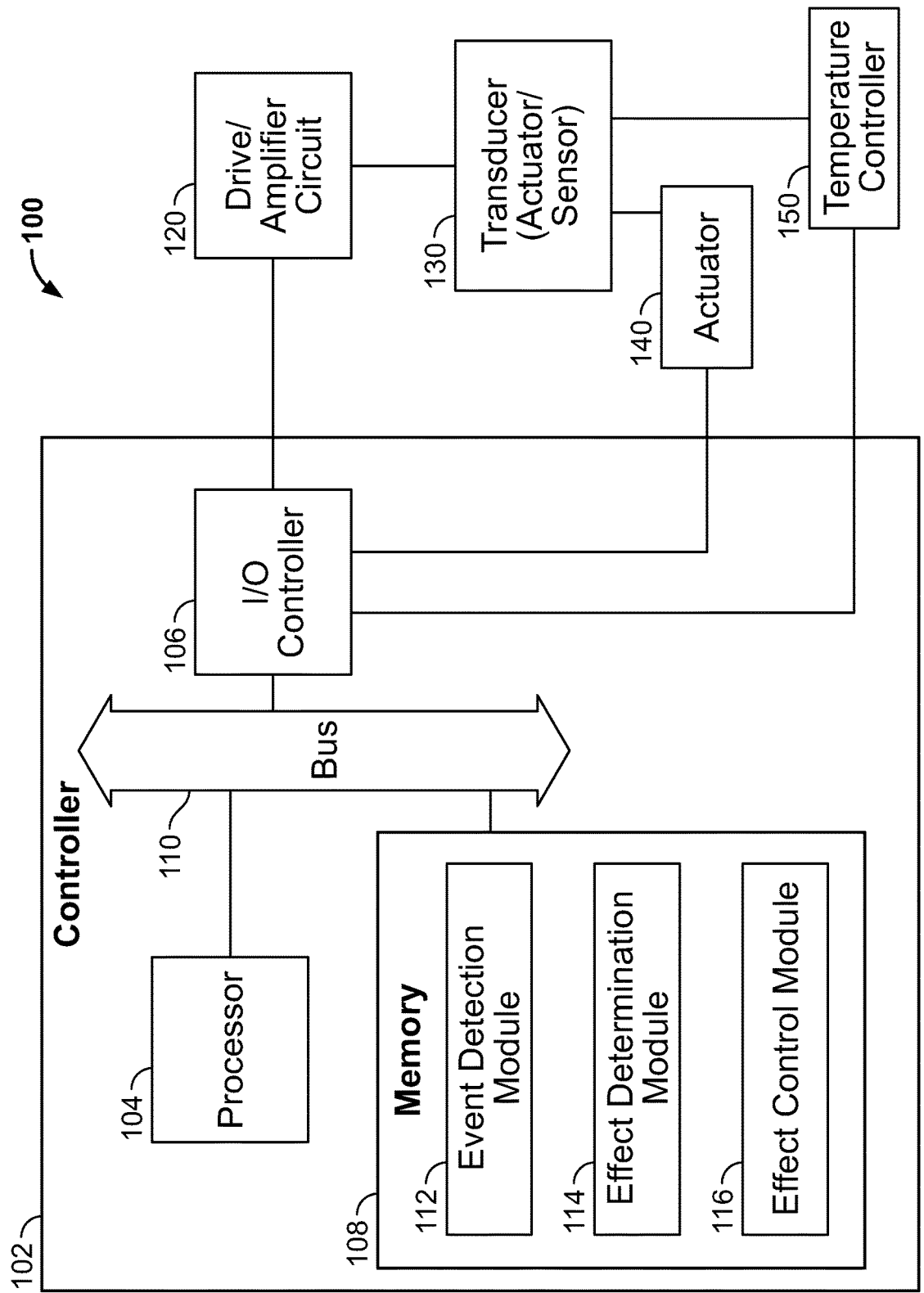
FIG. 1 is a block diagram illustrating an example of an article, such as a wearable article, having an actuator that performs non-haptic and haptic operations.

Various examples will be described in detail, some with reference to the drawings, wherein like reference numerals represent like parts and assemblies throughout the several views. Reference to various examples does not limit the scope of the claims attached hereto. Additionally, any examples set forth in this specification are not intended to be limiting and merely set forth some of the many possible embodiments for the appended claims.

Whenever appropriate, terms used in the singular also will include the plural and vice versa. The use of "a" herein means "one or more" unless stated otherwise or where the use of "one or more" is clearly inappropriate. The use of "or" means "and/or" unless stated otherwise. The use of "comprise," "comprises," "comprising," "include," "includes," "including," "has," and "having" are interchangeable and not intended to be limiting. The term "such as" also is not intended to be limiting. For example, the term "including" shall mean "including, but not limited to."

In general, this disclosure relates to actuators, such as haptic actuators, more specifically to haptic actuator systems that can deform locally.

Referring to FIG. 1, in one example, a system 100 employing a haptic actuator 130, such as those described in this disclosure also includes a controller 102. The controller 102 generally includes a bus 110, a processor 104, an input/output (I/O) controller 106 and a memory 108. The bus 110 couples the various components of the controller 102, including the I/O controller 106 and memory 108, to the processor 104. The bus 110 typically comprises a control bus, address bus, and data bus. However, the bus 110 can be any bus or combination of busses suitable to transfer data between components in the controller 102.

The processor 104 can comprise any circuit configured to process information and can include any suitable analog or digital circuit. The processor 104 can also include a programmable circuit that executes instructions. Examples of programmable circuits include microprocessors, microcontrollers, application specific integrated circuits (ASICs), programmable gate arrays (PGAs), field programmable gate arrays (FPGAs), or any other processor or hardware suitable for executing instructions. In the various embodiments, the processor can comprise a single unit, or a combination of two or more units, with the units physically located in a single controller or in separate devices.

The I/O controller 106 comprises circuitry that monitors the operation of the controller 102 and peripheral or external devices. The I/O controller 106 also manages data flow between the controller 102 and peripherals or external devices. The external devices can reside in the same device in which the system 100 is incorporated or can be external to the device in which the system 100 is incorporated. Examples of peripheral or external devices with which the I/O controller 106 can interface include switches, sensors, external storage devices, monitors, input devices such as keyboards, mice or pushbuttons, external computing devices, mobile devices, and transmitters/receivers.

The memory 108 can comprise volatile memory such as random access memory (RAM), read only memory (ROM), electrically erasable programmable read only memory (EEPROM), flash memory, magnetic memory, optical memory or any other suitable memory technology. The memory 108 can also comprise a combination of volatile and nonvolatile memory.

The memory 108 is configured to store a number of program modules for execution by the processor 104. The modules can, for example, include an event detection module 112, an effect determination module 114, and an effect control module 116. Each program module is a collection of data, routines, objects, calls and other instructions that perform one or more particular task. Although certain program modules are disclosed herein, the various instructions and tasks described for each module can, in various embodiments, be performed by a single program module, a different combination of modules, modules other than those disclosed herein, or modules executed by remote devices that are in communication with the controller 102.

The event detection module 112 is programmed to evaluate received event data to determine if the event data is associated with a predetermined event, such as a haptic effect. The event data can comprise data generated by an event occurring in a device in which the system 100 is incorporated; examples of such devices are provided herein. Alternatively, the event data can comprise data generated by a device or system that is separate from the device incorporating the system 100. An event can, for example comprise, an individual input (e.g., a button press, the manipulation of a joystick, user interaction with a touch sensitive surface, tilting or orienting a user interface device). In another example, the event can comprise a system status (e.g., low battery, low memory, an incoming call), a sending of data, a receiving of data, or a program event (e.g., a game program producing the explosions, gunshots, collisions, interactions between characters, bumpy terrains).

In some example embodiments, the occurrence of an event is detected by one or more sensors, e.g. external device(s). Examples of sensors include acoustical or sound sensors such as microphones; vibration sensors; chemical and particle sensors such as breathalyzers, carbon monoxide and carbon dioxide sensors, and Geiger counters; electrical and magnetic sensors such as voltage detectors or hall-effect sensors; flow sensors; navigational sensors or instruments such as GPS receivers, altimeters, gyroscopes, or accelerometers; position, proximity, and movement-related sensors such as piezoelectric materials, rangefinders, odometers, speedometers, shock detectors; imaging and other optical sensors such as charge-coupled devices (CCD), CMOS sensors, infrared sensors, and photodetectors; pressure sensors such as barometers, piezometers, and tactile sensors; force sensors such as piezoelectric sensors and strain gauges; temperature and heat sensors such as thermometers, calorimeters, thermistors, thermocouples, and pyrometers; proximity and presence sensors such as motion detectors, triangulation sensors, radars, photo cells, sonars, and hall-effect sensors; biochips; biometric sensors such as blood pressure sensors, pulse/ox sensors, blood glucose sensors, and heart monitors. Additionally, the sensors can be formed with smart materials, such as piezo-electric polymers, which in some embodiments function as both a sensor and an actuator.

Upon the event detection module 112 determining that event data is associated with a haptic effect, the effect determination module 114 determines which effect, such as a haptic effect, to deliver. An example technique that the effect determination module 114 can use to determine a haptic effect includes rules programmed to make decisions to select a haptic effect. Another example technique that can be used by the effect determination module 114 to select a haptic effect includes lookup tables or databases that relate the haptic effect to the event data.

Upon the effect determination module 114 determining which haptic effect to deliver, the effect control module 116 directs generation of a haptic signal. The effect control module controls communication of signal parameters defined by the haptic data to the I/O controller 106. The signal parameters define the drive signal that is applied to the haptic actuator 130. Examples of parameters that can be defined by the haptic data includes frequency, amplitude, phase, inversion, duration, waveform, attack time, e time, fade time, and lag or lead time relative to an event.

The I/O controller 106 uses the signal parameters to generate a haptic signal embodying the haptic data and communicates the haptic signal to the actuator drive circuit 120, which can comprise drivers, amplifiers, and other components for processing the haptic signal into a haptic drive signal. The actuator drive circuit 120 applies the haptic drive signal to the haptic actuator 130, which then delivers the haptic effect.

The I/O controller 106 can further be connected to, and configured to control, one or more actuators 140 (including any suitable drivers/amplifiers), such as eletroactive polymer actuators, electromagnetic motors, or hydraulic or pneumatic actuators that are positioned adjacent haptic transducer 130 and configured to locally deform a portion of the haptic transducer 130, as described in more detail below. The I/O controller 106 can further be connected to, and configured to control, one or more temperature controllers 150, such as heaters and coolers, for heating and/or cooling portions of the haptic transducer 130, such as one or more regions of a shape-memory material in the transducer actuator 130.

Turning now more specifically to haptic actuators themselves, according to one aspect of the present disclosure, a haptic actuator includes a shape-memory material, such as a shape memory polymer (SMP) is integrated with another actuator, such as an electroactive polymer (EAP (also referred to as electro-mechanical polymer (EMP) or artificial muscle (AM))) actuator (such as dielectric elastomer (DE) actuator) or electromagnetic motor. A shape-memory material typically has a shape-memory transition temperature, above which the material is malleable, and below which the material is rigid. The material may be deformed at temperatures above the transition temperature. The deformation can be maintained while the material is cooled to below the transition temperature. Upon the temperature returning to above the transition temperature, the material spontaneously returns to its pre-deformation shape. Shape memory also can be heated with types of energy other than thermal energy. For example, transition in certain shape-memory materials can be triggered by light. In a thermally-induced shape-memory polymer (SMP), the shape-memory transition temperature can be a glass transition temperature ($T_g$). The transition between the soft, rubbery state and hard, glassy state can take place over varying temperature ranges. For example, the transition can be fairly broad, e.g., over a range of 10 to 20° C.; or the SMP can have a very sharp transition, e.g., transition over a very narrow temperature range, e.g., about 5° C. or 3° C. The glass transition temperature and transition range can be chosen depending on specific application. For example, for applications where a haptic actuator is placed at room temperature, and the transition is to be induced by a touch of a finger, a material with a $T_g$ at or slightly below the lowest anticipated room temperature can be chosen; the transition temperature range can be chosen depending on the sharpness of haptic stimulation desired. In selecting shape-memory materials, other properties, such as electrical properties, optical properties and chemical properties, can be taken into consideration. For example, a transparent SMP may be used (for example, in conjunction with transparent EAP and electrodes) in transparent actuator arrays, such as displays with localized haptic feedback for tablet computers and smartphones.

The shape-memory material and the other actuator can be integrated in a variety of forms. For example, a layer of shape-memory material can be laminated to or otherwise placed in contact with, or placed in close proximity to, a layer of EAP. In other examples, a shape-memory polymer can be combined with an EAP to form an inter-penetrating network.

A haptic actuator can also be made of a material that exhibits both shape-memory behavior and non-shape memory transducer (such as electro-mechanical) behavior. For example, an SMP can be chemically modified to act also as an EAP (such as a dielectric elastomer actuator (DEA)). For example, an amorphous polymer material can be chemically modified to lower its $T_g$ to a desired temperature. As a result, above the $T_g$, it can be activated to act as both SMP and EAP. In another example, an SMP can be blended/mixed with a smart material actuator to act as both actuator and SMP. For example, piezoelectric polymer material can be mixed with an SMP, or piezo-fiber polymer can be embedded within an SMP matrix for the same purpose. Many combinations of polymer blends/alloys can be used. An example of such a material is disclosed in Niu et al., "Bistable Large-Strain Actuation of Interpenetrating Polymer Networks," *Advanced Materials*, Vol. 24, 6513-6519 (2012). This paper discloses a bistable electroactive polymer (BSEP) composed of interpenetrating networks (IPN) of chemically crosslinked poly(tert-butyl acrylate) (PTBA). For example, a crosslinked PTBA membrane (the first network) was prepared by UV-initiated free-radical bulk polymerization of a liquid membrane consisting of tert-butyl acrylate, a crosslinker, and a photoinitiator. The cured membrane was immersed in a solution containing tert-butyl acrylatemonomer, a crosslinker, photoinitiator, and toluene as the solvent. After the membrane had swollen to a gel-like state, it was cured under UV exposure. The membrane was then thermally annealed to remove residual monomer and solvent, and to increase the crystallinity of the polymer to enhance mechanical rigidity at room temperature and elasticity in the rubbery state. The resulting material was a membrane having interpenetrating networks of PTBA (PTBA-IPN). The resulting PTBA-IPN membranes exhibit a stable modulus above the glass transition. Electromechanical strain as large as 228% in area expansion has been obtained at the rubbery state.

Figure 2:
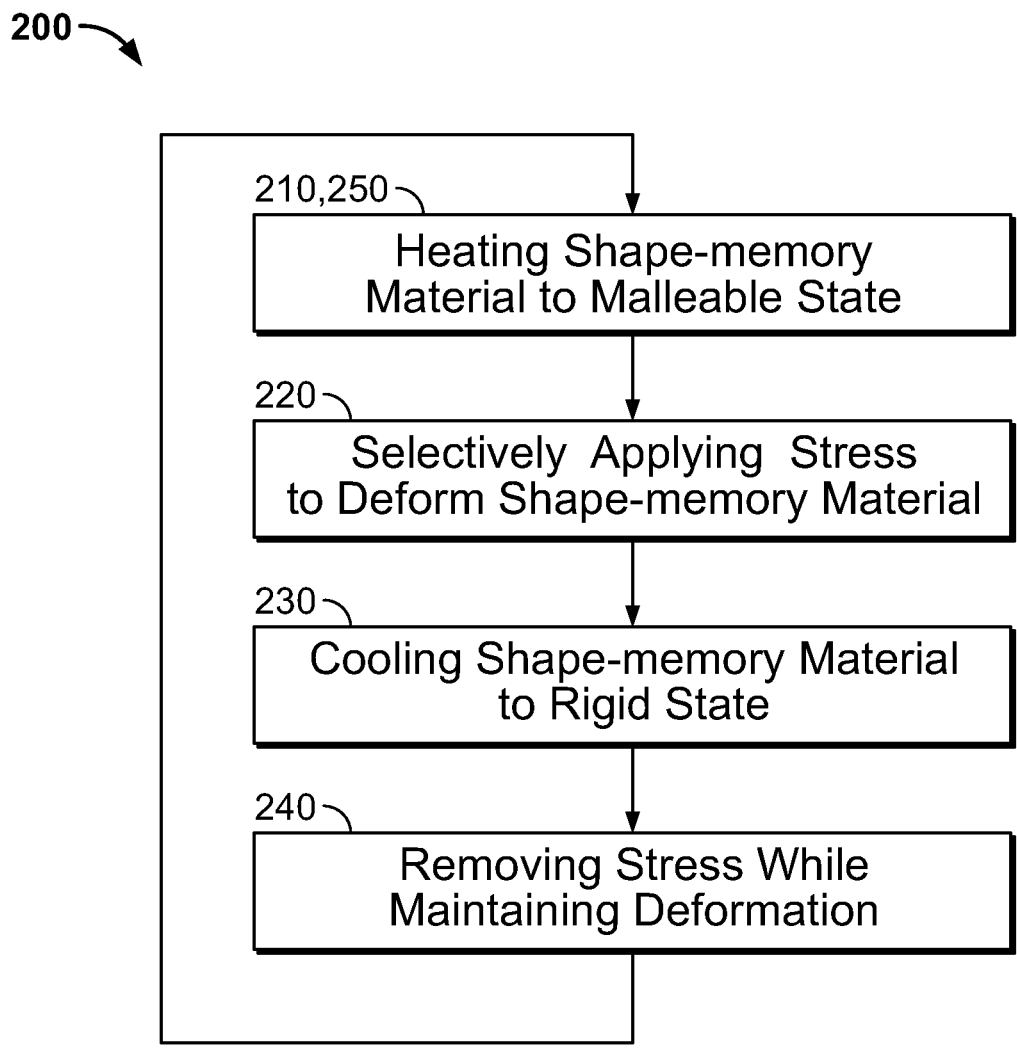
FIG. 2 is a flowchart outlining a process of local actuation using a haptic actuator device according to an aspect of the present disclosure.

In one aspect of the present disclosure, regions in a sheet comprising a shape memory material in a haptic actuator system can be independently actuated. In one example, such independent actuation can include the process 200 outlined in FIG. 2. First (210), at least a selected one of the regions is heated or otherwise has its temperature set to above the shape-memory transition temperature, such that the material in the at least one region is malleable. Although in certain examples, one or more regions to be selectively actuated can be individually heated or otherwise have their temperatures controlled, more regions can be heated or otherwise temperature-controlled. Next (220), stress is selectively applied to the at least one of the heated regions to deform the region. Deformation can be of any type, including compressive, tensile and flexural. Next (230), at least the deformed region or regions are cooled to below the shape-memory transition temperature while the deformation is maintained. Depending on the mechanical properties of the deformed region, deformation can be maintained with or without the application of external stress. Next (240), the stress, if applied during cooling, is removed. At this point, the sheet in the haptic actuator system includes a locally deformed region or regions. Next (250), at least the deformed region or regions are heated to above the shape-memory transition temperature, causing the deformed region or regions to return to the pre-deformation shape, thereby providing a mechanical output, such as a haptic feedback.

In one example, a locally deformable haptic actuator system has an SMP integrated with an EAP. In this case, heated SMP is deformed by electro-active polymer (EAP). Then while or after cooling SMP, the EAP is deactivated. The deactivation saves power. Electromagnetic motors can also be used to deform SMP and then be turned off when or after the SMP is cooled. As another example, thermally activated actuators can be used. For example, a thermally activated actuator, such as a bimetallic actuator, can be attached to an SMP. Upon heating, both SMP and bimetallic actuator respond: The SMP becomes soft, and the actuator becomes deformed and thus pushing the soft SMP in a direction (e.g, in or out) depending on the desired haptic effect. In other examples, a wax or low melting point material, such as a shape-shifting liquid-metal, inside a rubber, or other types of resilient, cover can be used in a similar way as SMP. Wax or shape-shifting metal-liquid material is heated first and then total system (wax+rubber) deformed by external actuation system (e.g., EAP, dielectric elastomer, motor) and then freeze again while turning off the actuation system. The elastic cover material forces the system to go back to the original state due to its spring property. Examples of shape-shifting metal-liquid material include paraffin wax and metals such as francium, cesium, gallium, rubidium, or combinations of these materials as an alloy or blend. Low-melting-point polymers, such as polycaprolactone (PCL), or chemically modified version thereof, can also be used to tune the melting temperature.

Because polymers are typically thermal insulators, it is possible to change the temperature of SMPs locally and substantially maintain the temperature of other part of the polymer. The deformation/change shape can occur only at the place where it is heated. The SMP can be programmed (e.g., by a thermo-mechanical process) to return to its original shape by thermo-mechanical process. For instance, a flat SMP can be programmed to change shape into a concave/convex form. To accomplish this, SMP is first head to above its $T_g$ and then deformed. Subsequently, the SMP can be quenched (cooling to below $T_g$) to the desired shape (e.g., concave/convex shape). Then upon re-heating to above $T_g$, the SMP return to the original shape (e.g., flat).

Certain SMP materials are nonreversible, i.e., the material cannot return to the deformed (e.g., concave/convex) shape if heated. For such materials the SMP is coupled with another actuator, as discussed above, to produce local deformation. Certain other types of SMP are reversible. For example, one family of liquid crystal materials show reversible shape memory behavior where the orientation of the mesogen (micro or nano domain) changes with temperature. Such materials can be used directly, i.e., without the need of another actuator such as EAP, in haptic actuator systems capable of local actuation. Using an integrated structure of shape-memory material and actuator can be beneficial in certain applications, including producing stronger haptic actuation. In certain examples, reversible shape-memory materials also can be integrated with non-shape-memory actuator materials to enhance the deformation.

In certain embodiments, electrodes can be formed on integrated SMP/EAP or SMP/dielectric elastomer structures (e.g., laminated or interpenetrating structure). Voltage can be applied to the electrodes to deform structure. For example, electrodes can be formed on top and bottom sides of a sheet of integrated SMP/EAP or SMP/dielectric elastomer. The sheet, or one or more selected regions of the sheet can be heated first to make region or regions become soft/rubbery; then electrical field can be applied to region or regions to locally produce deformation. Then, electric field can be turned off after cooling the sheet or the one or more regions. If the one or more region is heated again, it/they will return to the original shape.

In certain examples, a material, such as PVDF, can have both electro-active and shape-memory properties. In the manufacturing process, the shape-memory properties in some cases can be controlled independently from the electro-active properties. Such materials can be used in place or in combination with SMP-actuator combinations.

Figure 3A:
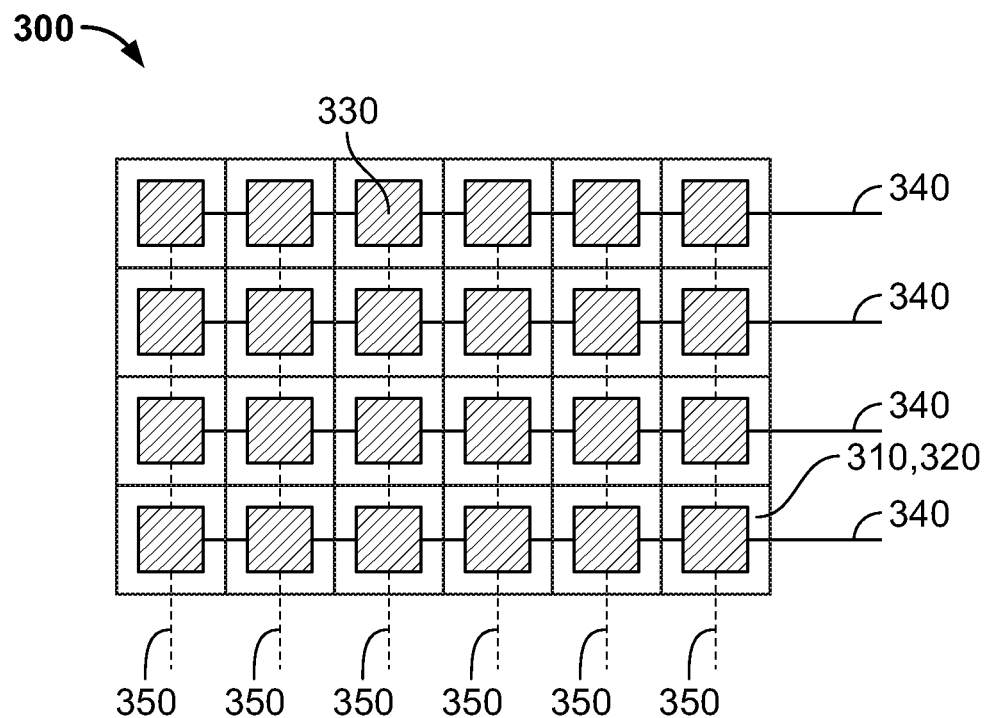
FIG. 3(a) is a schematic top view of a haptic actuator device with selectively, electromechanically actuated, regions according to one aspect of the present disclosure. The lines delineating the regions are added in the drawing for illustrative purposes and are not physical features in the device in this example.
Figure 3B:
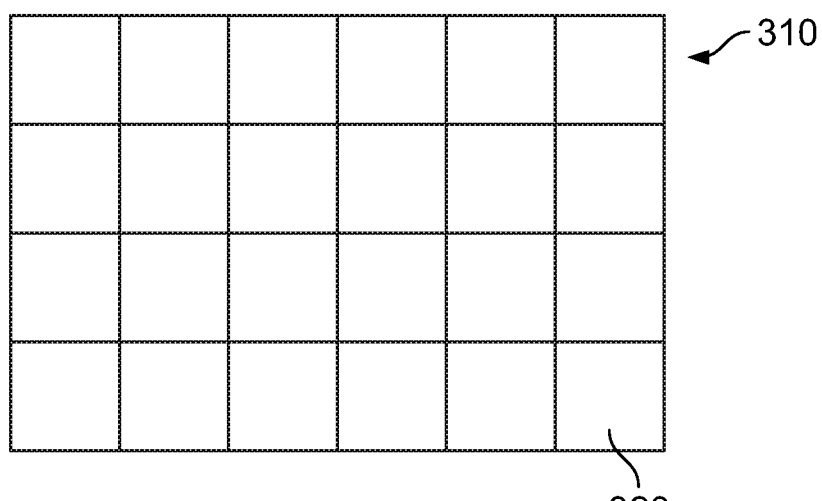
FIG. 3(b) schematically shows the haptic actuator device of FIG. 3(a) but without the electrodes.
Figure 3C:
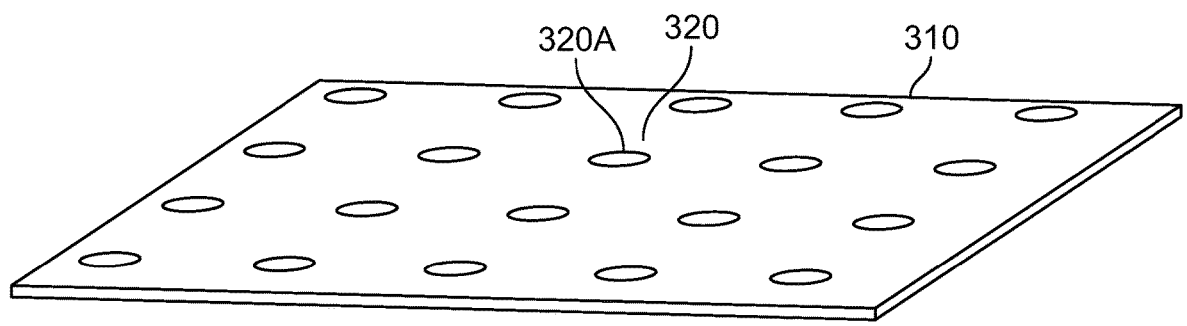
FIG. 3(c) schematically shows another view of the haptic device shown in FIG. 3(b), indicating regions to be deformed.
Figure 3D:
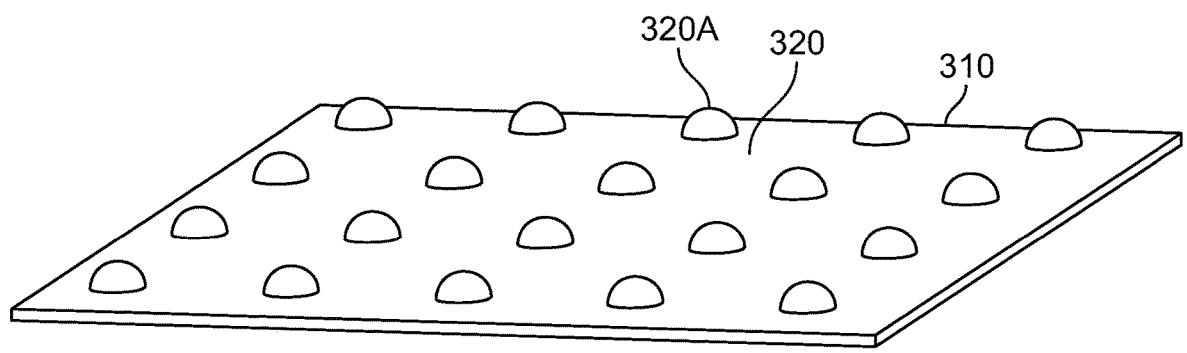
FIG. 3(d) schematically shows the haptic actuator device shown in FIG. 3(d), with the deformable regions illustrated in their deformed state.

Turning to more specific examples, referring to FIGS. 3(a) and 3(b), a surface with local deformation can be achieved with a haptic actuator system 300 having a sheet 310 (preferably thin) of a SMP material or SMP/EAP or SMP/dielectric elastomer combination. The sheet includes a plurality of regions 320 to be independently deformed. As schematically shown in FIGS. 3(c) and 3(d), each of the deformable portions 320 includes at least a deformable portion 320A, which can be independently disposed in an undeformed state (as in FIG. 3(c)) and deformed state (as in FIG. 3(d)). Although the regions 320 are depicted by dividing lines in FIGS. 3(a) and 3(b) for visual separation, the regions 320 are not physically divided in this illustrative example, but can be in alternative embodiments. Top conductive electrode pads 330 are formed on the top surface of the respective regions 320, and in this case are arranged in a matrix; bottom conductive electrodes (not shown) are formed on the bottom surface of the respective regions 320. Top conductive lines 340 each connects a row of the top electrodes 330 to a power source (not shown), such as an output of a driver circuit. Bottom conductive lines 350 each connects a column of the bottom electrodes to a power source (not shown). Thus, the conductive lines form a network-like configuration (cross orientation), and a voltage, or electrical field, can be applied to a specific region 320 between a selected pair of top and bottom conductive lines 340,350 relative to each other. When a pair of top and bottom electrodes are biased relative to each other, the region 320 at the intersection of the pair is subjected to an electrical field, and deformed if the temperature of the region is above the shape-memory transition temperature. Instead of conductive pads 320 interconnected by thinner conductive lines 340 (or 350 on the bottom side), the conductive lines 340,350 can be wide conductive bands, and each band 340 on top overlaps each band 350 at the bottom at a respective region 320 of the sheet 310.

In another aspect of the present disclosure, the structure disclosed above, with electrodes sandwiching a sheet of SMP/EAP or SMP/dielectric elastomer, can be used as a sensor array or matrix. The sheet 310 is an insulator. The conductive pads (including the top electrodes 320 and bottom electrodes) and the insulating sheet form an array of capacitors, which can be used as capacitance sensors, which detects touch by, or proximity of, a conductive object such as human finger from the change in capacitance. Therefore, the actuator array, or matrix, can also be used as touch capacitor sensors to take user input, and the conductive lines 340,350 are not only power lines for selectively deforming the regions 320 in the sheet 310, but also data lines for transmitting signals from the capacitive touch sensor array to a receiving circuit, such as an I/O port for a microprocessor. The dual functions of haptic actuator and sensor can be invoked sequentially. For example, during an input-detection period, a device employing the haptic actuator/sensor 300 can be put into an input-detection state, in which the signals from the electrodes 330 are monitored. Next, during and actuation period, the device can be put into an actuation state, in which, the region 320 of interest can be actuated by first heating that region 320, then applying a voltage to deform and then quenching that region 320 rapidly. The region 320 can return to the original shape (e.g., flat) if heated again. The location of the output, i.e., the specific region 320 to be actuated, can be determined, for example, by a microprocessor or microcontroller (not shown) in the device employing the haptic actuator/sensor 300.

In certain implementations, the shape-memory transition temperature (e.g., $T_g$ of SMP) of the selected material can be very close to the temperature of the environment in which the haptic sensor devices operate. For example, the shape-memory transition temperature (e.g., $T_g$ of SMP) of the selected material can be very close to ambient temperature (room temperature) (but sufficiently outside the range of expected normal temperature fluctuation for a given environment) so as to minimize the temperature gradient between different regions 320 of the sheet 310, and to produce rapid response without the need to heat or cool the shape-memory material over a large temperature range.

Temperature control (heating and quenching) of the regions 320 can be accomplished using a variety of methods and devices. Examples of heating methods include ultrasonic heating, laser heating and resistive heating; examples of cooling methods include using ultra-thin coolers such as dual piezo cooling jets, and semiconductor cooling devices such as Peltier junction coolers.

Figure 4:
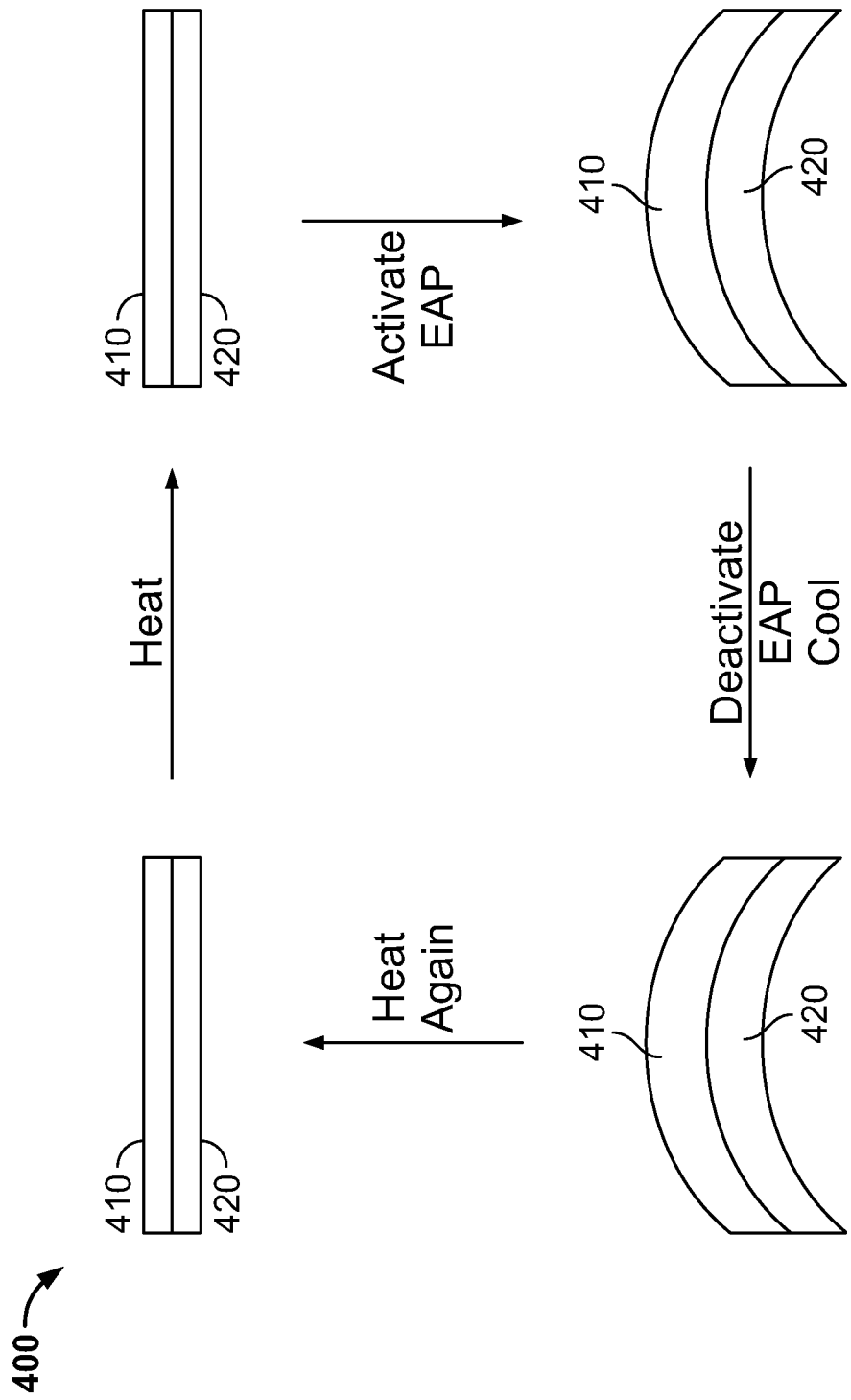
FIG. 4 is a schematic illustration of a portion of a haptic actuator device, having a layer of shape-memory polymer (SMP) laminated with a layer of electroactive polymer (EAP), undergoing the process outlined in FIG. 2.

An example haptic actuator system 400 using an SMP/EAP combination, and its actuation cycle is illustrated in FIG. 4. A sheet having an SMP layer 410 and EAP layer 420 laminated to the SMP layer 410 can be initially in a rigid state, in which the temperature of a region (such as region 320) in a sheet (such as sheet 310) is below $T_g$. The region 320 can be heated to above $T_g$, such that the SMP layer 410 become soft (malleable). At this point, the EAP layer 420 can be activated, e.g., by applying a voltage, to produce a deformation in the EAP layer 420 as well as the SMP layer 410 attached to it. The deformation in this specific example is shown as flexural but can be other forms of deformation. Next, layers 410,420 can be cooled (preferably rapidly) to below $T_g$, during or after which the EAP layer 420 is deactivated. The deformation is maintained because the SMP layer 410 is rigid in the lowered temperature. Next, the region (320) can then be heated to above $T_g$ and returns to its pre-deformation state.

Figure 5:
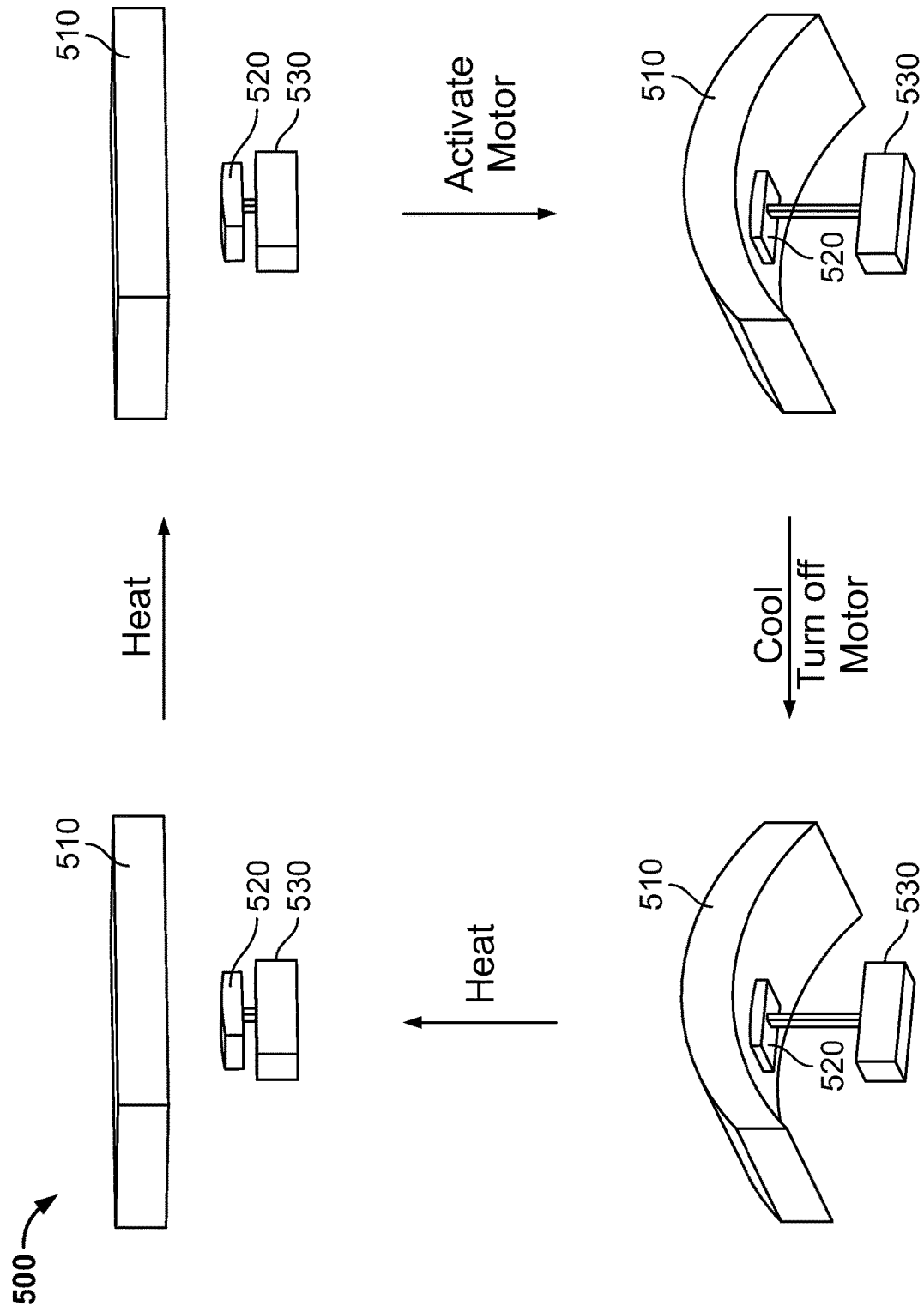
FIG. 5 is a schematic illustration of a portion of a haptic actuator device, having a layer of shape-memory polymer (SMP) and adjacent electromechanical motors, undergoing the process outlined in FIG. 2.

An example haptic actuator system 500 using an SMP/motor combination, and its actuation cycle is illustrated in FIG. 5. A sheet having an SMP layer 510 can be initially in a rigid state, in which the temperature of a region (such as region 320) in a sheet (such as sheet 310) is below $T_g$. The region 320 can be heated to above $T_g$, such that the SMP layer 510 become soft (malleable). At this point, an actuation head 520, which is disposed adjacent the region 320, can be activated, e.g., pushed by an electromagnetic motor 530, to produce a deformation in the SMP layer 510 attached to it. The deformation in this specific example is shown as flexural but can be other forms of deformation. Next, SMP layer 510 can be cooled (preferably rapidly) to below $T_g$, during or after which the force on the SMP layer 510 by the actuation head 520 is removed. The deformation is maintained because the SMP layer 510 is rigid in the lowered temperature. Next, the region (320) can then be heated to above $T_g$ and returns to its pre-deformation state.

In an additional example, the force from a user input (e.g., force from finger press) can be used to deform SMP. A surface can be made of an SMP layer, with electrodes on top and bottom in a similar arrangement as in FIG. 3. User input (e.g., finger press) to a specific location can be detected by, for example, the capacitive touch sensor formed by the electrodes and SMP. Then, the region 320 pressed by the user is heated to $T_g$. As a result, the region 320 that the user touches is deformed. The surface thus provides a natural haptic feedback. One or more actuators (EAP, motor, etc.) underneath the surface can also be sued to push the SMP layer back to the original state, thereby providing an additional force, or a secondary haptic feedback, to the user.

Combinations of SMP and actuators can be used in additional applications. For example, certain actuation systems, such as active suspension systems, use a combination of actuators and damping mechanisms. Using SMP as at least a part of the damping mechanisms, the damping characteristics (e.g., damping coefficient) can be adjusted by thermal excitation. In particular, for example, using localized heating, different proportions of the SMP can be heated to above glass-transition temperature and thus becomes compliant. Different damping characteristics can thus be achieved.

The various embodiments described above are provided by way of illustration only and should not be construed to limit the claims attached hereto. Those skilled in the art will readily recognize various modifications and changes that may be made without following the example embodiments and applications illustrated and described herein, and without departing from the true spirit and scope of the following claims.

The invention claimed is:

1. A haptic actuator device comprising:
   a surface having a mechanical property responsive to a localized temperature change, the surface including a sheet having a plurality of regions configured to be independently actuated and deformed;
   an actuator configured to selectively apply a stress to a specific region of the plurality of regions that causes the specific region to be deformed in response to heating the specific region above a transition temperature, resulting in a localized deformation of the surface at the specific region; and
   a temperature controller adapted to control a temperature of the specific region of the plurality of regions;
   wherein the localized deformation is generated in response to the localized temperature change caused by a user input, and
   wherein the specific region maintains a deformed shape when the specific region is cooled below the transition temperature, and the specific region returns to a pre-deformation shape when the stress applied is withdrawn and the specific region is subsequently heated above the transition temperature.

2. The haptic actuator device of claim 1, wherein a plurality of actuators are disposed adjacent to the plurality of regions, each actuator of the plurality of actuators corresponding to a respective one of the plurality of regions.

3. The haptic actuator device of claim 1, wherein the sheet comprises a shape-memory material.

4. The haptic actuator device of claim 3, wherein the shape-memory material comprises a shape-memory polymer (SMP).

5. The haptic actuator device of claim 4, wherein the actuator comprises an electroactive polymer (EAP) mixed with the shape-memory polymer, or forming a layered structure with the (SMP), the layered structure comprising a layer comprising the SMP and an EAP layer adjacent the layer comprising the SMP; and wherein the haptic actuator device further comprises a first plurality of electrodes on one side of the sheet and a second plurality of electrodes on the other side of the sheet, the first plurality of electrodes and the second plurality of electrodes being configured to selectively apply an electric field locally to the specific region of the plurality of regions in the sheet depending on voltages applied to the first plurality of electrodes and the second plurality of electrodes.

6. The haptic actuator device of claim 5, wherein the first plurality of electrodes comprise a first plurality of conductive paths substantially parallel to each other, and the second plurality of electrodes comprise a second plurality of conductive paths substantially parallel to each other, the first plurality of conductive paths being substantially transverse to the second plurality of conductive paths, the first and second pluralities of conductive paths overlapping each other across the plurality of regions.

7. The haptic actuator device of a claim 6, wherein each of the first plurality of conductive paths and the second plurality of conductive paths comprises a plurality of conductive pads, each of the plurality of conductive pads in the first plurality of conductive paths being substantially aligned across a corresponding one of the plurality of regions with one of the plurality of conductive pads in the second plurality of conductive paths.

8. The haptic actuator device of claim 5, wherein the sheet comprises interpenetrating networks of SMP and EAP.

9. The haptic actuator device of claim 1, wherein the actuator comprises a plurality of electromagnetic motors, each including an actuation head disposed adjacent a corresponding one of the plurality of regions of the surface, each of the plurality of electromagnetic motors configured to move its actuation head to apply a stress to a corresponding one of the plurality of regions of the surface.

10. An actuation system, comprising:
a haptic actuator device of claim 1; and
a controller operatively connected to the haptic actuator device and configured to drive the actuator to selectively deform the specific region of the plurality of regions in the sheet.

11. The actuation system of claim 10, wherein the surface comprises a sheet of shape-memory material comprising a shape-memory polymer (SMP);
the haptic actuator device comprises an electroactive polymer (EAP) mixed with the shape-memory polymer, or forming a layered structure with the SMP, the layered structure comprising a layer comprising the SMP and an EAP layer adjacent the layer comprising the SMP, the haptic actuator device further comprising a first plurality of electrodes on one side of the sheet and a second plurality of electrodes on the other side of the sheet, the first plurality of electrodes and the second plurality of electrodes configured to selectively apply an electric field locally to the specific region of the plurality of regions in the sheet depending on voltages applied to the first plurality of electrodes and the second plurality of electrodes; and
the controller is configured to apply voltages to the first plurality of electrodes and the second plurality of electrodes to selectively apply an electric field locally to the specific region of the plurality of regions in the sheet.

12. The actuation system of claim 11, the controller is further configured to detect signals from the first plurality of electrodes and the second plurality of electrodes.

13. The actuation system of claim 12, wherein the controller is further configured to detect the signals from the first plurality of electrodes and the second plurality of electrodes and apply the voltages to the first plurality of electrodes and the second plurality of electrodes to selectively apply an electric field to the regions in the sheet based at least in part on the detected signals.

14. The haptic actuator device of claim 1, wherein each of the plurality of regions includes at least one deformable portion independently disposed in an undeformed state or a deformed state.

15. A method of providing localized haptic actuation, the method comprising:
selectively applying a stress, using an actuator, to cause a specific region of a plurality of regions in a sheet comprised in a surface to be locally deformed in response to heating the specific region above a transition temperature, resulting in a localized deformation of the surface at the specific region;
controlling, using a temperature controller, a temperature of each of the plurality of regions;
wherein the surface has a mechanical property responsive to a localized temperature change and the plurality of regions are configured to be independently actuated and deformed;
wherein the localized deformation is generated in response to the localized temperature change caused by a user input; and
wherein the specific region maintains a deformed shape when the specific region is cooled below the transition temperature, and the specific region returns to a pre-deformation shape when the stress applied is withdrawn and the specific region is subsequently heated above the transition temperature.

16. The method of claim 15, wherein:
the surface comprises a shape-memory material; and
a temperature of the specific region of the plurality of regions in the surface is controlled to be above or below a shape-memory transition temperature of the shape-memory material by the temperature controller;
the method further comprising:
while maintaining the specific region of the plurality of regions in the deformed shape, lowering the temperature of the specific region of the plurality of regions to below the shape-memory transition temperature;
withdrawing the applied stress after deformation; and
reheating the specific region of the plurality of regions to above the shape-memory transition temperature of the shape-memory material, thereby causing the specific region of the plurality of regions to return to its pre-deformation shape.

17. A non-transitory computer-readable medium having instructions stored thereon that, when executed by a processor, causes the processor to carry out a process for localized haptic actuation, the process comprising:
selectively controlling, using at least one temperature controller, a temperature of a specific region of a plurality of regions of a surface having a mechanical property responsive to a localized temperature change, the plurality of regions being configured to be independently actuated and deformed; and
controlling an actuator to selectively apply a stress to cause the specific region of the plurality of regions to be locally deformed in response to heating the specific region above a transition temperature, resulting in a localized deformation of the surface at the specific region;

wherein the localized deformation is generated in response to the localized temperature change caused by a user input; and wherein the specific region maintains a deformed shape when the specific region is cooled below the transition temperature, and the specific region returns to a pre-deformation shape when the stress applied is withdrawn and the specific region is subsequently heated above the transition temperature.

18. The non-transitory computer-readable medium of claim 17, wherein the process further comprises:

heating the specific region of a plurality of regions of the surface to above the transition temperature for a mechanical property of the surface before controlling the actuator to selectively apply a stress to cause the specific region of the plurality of regions of the surface to be locally deformed;

while maintaining the specific region of the plurality of regions in the deformed shape, cooling the specific region of the plurality of the regions to below the transition temperature;

withdrawing the applied stress after the localized deformation; and reheating the specific region of the plurality of regions to above the transition temperature, thereby causing the specific region of the plurality of regions to return to its pre-deformation shape.

19. The non-transitory computer-readable medium of claim 18, wherein:

the heating comprises heating the specific region of the plurality of regions of the surface to above a shape-memory transition temperature of the surface; and the cooling comprises cooling the specific region of the plurality of regions of the surface to below the shape-memory transition temperature of the surface.

* * * * *